(12) United States Patent
Shakuda et al.

(10) Patent No.: US 6,236,067 B1
(45) Date of Patent: May 22, 2001

(54) SEMICONDUCTOR LIGHT EMITTING DEVICE USING AN ALGAINP GROUP OR ALGAAS GROUP MATERIAL

(75) Inventors: Yukio Shakuda; Yukio Matsumoto; Shunji Nakata, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/203,405

(22) Filed: Dec. 2, 1998

(30) Foreign Application Priority Data

Dec. 5, 1997 (JP) .................................................. 9-335449

(51) Int. Cl.⁷ .................................................. H01L 33/00
(52) U.S. Cl. .............................. 257/103; 257/86; 257/94; 257/96
(58) Field of Search ............................... 257/94, 96, 103, 257/86; 372/45, 46, 47

(56) References Cited

U.S. PATENT DOCUMENTS

| 5,270,246 | * | 12/1993 | Mannou et al. ........................ 438/46 |
| 5,777,349 | * | 7/1998 | Nakamura et al. ..................... 257/94 |

FOREIGN PATENT DOCUMENTS

| 6-061525A | 3/1994 | (JP) . |
| 8-228022A | 9/1996 | (JP) . |
| 9-260724A | 10/1997 | (JP) . |
| 10-214996A | 8/1998 | (JP) . |

* cited by examiner

*Primary Examiner*—Minh Loan Tran
(74) *Attorney, Agent, or Firm*—Arent Fox Kintner Plotkin & Kahn, PLLC

(57) ABSTRACT

A semiconductor light emitting device is disclosed. An emitting layer forming portion for forming an emitting layer made of a compound semiconductor of AlGaInP group or AlGaAs group including a n-type layer, an active layer and a p-type layer laid one on another is formed on a GaAs substrate. Further, a current diffusion layer of GaP is formed on the front surface of the emitting layer forming portion. The p-type layer between the active layer and the current diffusion layer is formed to the thickness of not less than about 2 $\mu$m, or the current diffusion layer is formed to the thickness of about 3 to 7 $\mu$m. As a result, the semiconductor light emitting device of a high luminance is thus realized, in which the distortion due to the lattice mismatch has no effect on the emitting layer.

8 Claims, 3 Drawing Sheets

SEMICONDUCTOR LIGHT EMITTING DEVICE USING AN ALGAINP GROUP OR ALGAAS GROUP MATERIAL

BACKGROUND OF THE INVENTION

1. Field of the Invention

The present invention relates to a light emitting device for emitting visible light using a compound semiconductor material of AlGaInP group or AlGaAs group, or more in particular to semiconductor light emitting device capable of preventing the reduction in luminance which otherwise might be caused by the distortion due to the difference of lattice constant between the semiconductor layers in a multilayer structure.

2. Description of the Prior Art

The conventional semiconductor light emitting device for emitting visible light uses a compound semiconductor material of AlGaInP group, for example, for a emitting layer forming portion, and has a structure as shown in FIG. 4. Specifically, in FIG. 4, an n-type clad layer 22 made of a semiconductor material of n-type AlGaInP group, an active layer 23 of a non-doped semiconductor material of AlGaInP group having a composition lower in band gap energy than the clad layer, and a p-type clad layer 24 made of a semiconductor material of p-type AlGaInP group are formed by epitaxial growth on a semiconductor substrate 21 of n-type GaAs, thereby forming a emitting layer forming portion 29 of a double hetero-junction structure. Further, a p-type current diffusion layer 25 made of GaP is sequentially formed by epitaxial growth on the surface of the emitting layer forming portion 29. Further, a p-side electrode 27 of Au—Ge—Ni alloy or the like is formed on the front surface of the p-type current diffusion layer 25, and an n-side electrode 28 of Au—Ge—Ni alloy or the like is formed on the reverse side of the semiconductor substrate 21.

In the light emitting device of this structure, the light from the front surface of the semiconductor multilayers, i.e. the light from the side of the p-side electrode 27 is utilized, and the p-side electrode 27 which blocks the light is formed as small as possible in an area. In order to emit light by containing carriers in the active layer 23 sandwitched between the clad layers 22, 24, on the other hand, the current desirably flows distributed over the entire active layer. For this purpose, the current diffusion layer 25 is formed as thick as about 10 to 70 $\mu$m to expand the current over the entire chip. This current diffusion layer 25 desirably not only diffuses the current but also fails to absorb the light emitted by the active layer 23, and is made of GaP which is large in band gap energy. Also, the p-type layer 24, the only function of which is to contain the carriers, is normally formed to the thickness of about 0.5 $\mu$m not to absorb light.

In the conventional semiconductor light emitting device having the structure shown in FIG. 4, the current diffusion layer, which diffuses the current, is required to be formed as thick as possible. However, the lattice constant of the current diffusion layer of GaP and that of the compound semiconductor layer of AlGaInP group or AlGaAs group used for the emitting layer forming portion are considerably different from each other, and therefore a distortion is liable to be caused by the lattice mismatch. Specifically, although the matching can be secured between the GaAs layer of the substrate and the emitting layer forming portion for forming an emitting layer, the matching between the emitting layer forming portion and the GaP layer is difficult to secure. The present inventors have vigorously studied a method of improving the luminance of the semiconductor light emitting device of this type. As a result, the inventors have discovered that the luminance is extremely reduced if the distortion due to the lattice mismatch affects the active layer constituting the emitting layer.

SUMMARY OF THE INVENTION

The object of the present invention which has been developed based on the knowledge described above is to provide a semiconductor light emitting device comprising a semiconductor multilayer portion forming an emitting layer made of a compound semiconductor of AlGaInP group or AlGaAs group, and a current diffusion layer of GaP formed on the semiconductor multilayer portion forming the emitting layer, the semiconductor light emitting device having such a structure that the distortion due to the lattice mismatch has no effect on the emitting layer and a high luminance is obtained.

A semiconductor light emitting device according to the present invention comprises a substrate made of GaAs, an emitting layer forming portion constituting a multilayer including an n-type layer, an active layer and a p-type layer made of a compound semiconductor of AlGaInP group or AlGaAs group formed on the substrate, and a current diffusion layer of GaP formed on the front surface of the emitting layer forming portion, wherein the p-type layer or the n-type layer between the active layer and the current diffusion layer is formed to the thickness of not less than about 2 $\mu$m.

The compound semiconductor of AlGaInP group is a material which is expressed as $(Al_xGa_{1-x})_{0.51}In_{0.49}P$, where x assumes various values between 0 and 1. The crystal mixing ratio of 0.51 and 0.49 between $Al_xGa_{1-x}$ and In indicates the ratio at which the material of AlGaInP group is matched in lattice with the semiconductor substrate of GaAs or the like on which it is laid. The compound semiconductor of AlGaAs group indicates a compound in which the ratio between Al and Ga with the total of unity can be changed variously.

With this structure, a distortion which may be caused by the difference in lattice constant between the compound semiconductor of AlGaInP group and GaP is absorbed by a thick clad layer and can be prevented from affecting the active layer, thereby making it possible to emit light with high efficiency. Even when light is absorbed into the clad layer, the emitting efficiency is improved even more, thus improving the luminance as a whole.

The current diffusion layer is formed to the thickness of not more than 10 $\mu$m so that the effect of the distortion due to the current diffusion layer on the emitting layer forming portion is considerably reduced, thereby further contributing to a higher luminance of the device.

The current diffusion layer is formed with a carrier concentration of $2\times10^{18}$ to $2\times10^{19}$ cm$^{-3}$ or a metal layer sufficiently thin to transmit the light is formed on the surface of the current diffusion layer. In this way, the current is liable to expand and therefore the expansion of the current due to a thinner current diffusion layer is desirably guaranteed.

Specifically, according to one aspect of the invention, there is provided a semiconductor light emitting device comprising an n-type GaAs substrate, an n-type clad layer made of a compound semiconductor of n-type AlGaInP group formed on the substrate, an active layer of a compound semiconductor of AlGaInP group smaller in band gap energy than the clad layer, a p-type clad layer formed of a p-type compound semiconductor of AlGaInP group larger in band gap energy than the active layer, and a current diffusion layer made of p-type GaP formed on the p-type clad layer, wherein the p-type clad layer is formed to the thickness of not less than about 2 μm.

According to another aspect of the invention, there is provided a semiconductor light emitting device comprising a substrate of GaAs, an emitting layer forming portion for forming an emitting layer constituting a multilayer including an n-type layer, an active layer and a p-type layer of a compound semiconductor of AlGaInP group or AlGaAs group formed on the substrate, and a current diffusion layer of GaP formed on the front surface of the emitting layer forming portion, where the current diffusion layer is formed to the thickness of about 3 to 7 μm.

With this structure, the current diffusion layer having a lattice constant different from that of the emitting layer forming portion is so thin that the lattice distortion due to the difference in lattice constant between the emitting layer forming portion and the current diffusion layer is absorbed also into the current diffusion layer. Therefore, the lattice distortion has only a small effect on the emitting layer forming portion. As a result, the light can be emitted substantially without reducing the emitting efficiency.

DESCRIPTION OF THE PREFERRED EMBODIMENTS

As described above, in order to improve the luminance of a semiconductor light emitting device of red visible light, the present inventors have vigorously studied. As a result, the inventors have discovered that a lattice distortion is generated by laying semiconductor layers of different lattice constant one on another and the distortion extends to the active layer constituting the emitting layer thereby to reduce the luminance conspicuously. After a further vigorous study, the present inventors have discovered that the effect of the distortion on the active layer can be reduced and the luminance can be improved by thickening the clad layer (such as a p-type layer) between the current diffusion layer of GaP and the active layer and/or by thinning the current diffusion layer by about 3 to 7 μm.

Figure 1:
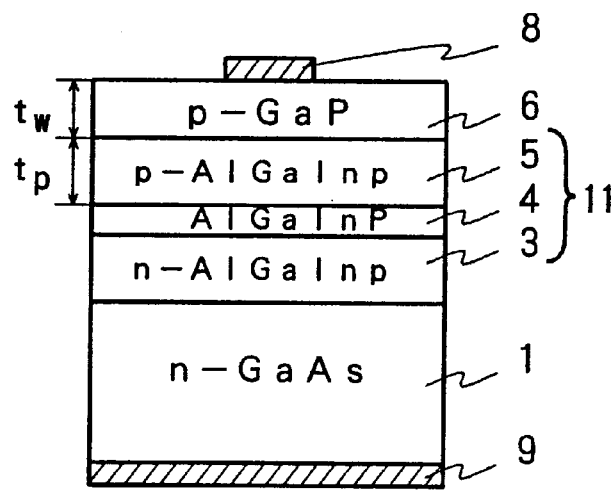
FIG. 1 is a diagram showing the sectional structure of an example of a semiconductor light emitting device according to the present invention.

A semiconductor light emitting device according to the present invention, as an example of the sectional structure thereof is shown in FIG. 1, comprises an n-type GaAs substrate 1, an n-type clad layer 3 made of a compound of AlGaInP, for example, formed on the GaAs substrate 1, and an emitting layer forming portion 11 including an n-type clad layer, an active layer 4 and a p-type clad layer 5 laid one on the other for forming an emitting layer. A current diffusion layer 6 made of p-type GaP is formed on the front surface of the emitting layer forming portion 11. According to this invention, the p-type clad layer 5 between the active layer 4 and the current diffusion layer 6 is formed to the thickness $t_p$ of not less than about 2 μm, or the current diffusion layer 6 is formed to the thickness $t_w$ of as small as about 3 to 7 μm.

The emitting layer forming portion 11 has a multilayer structure including an n-type clad layer 3 composed of a compound semiconductor of AlGaInP group having a carrier concentration of about $1 \times 10^{17}$ to $1 \times 10^{19}$ cm$^{-3}$ and a thickness of about 0.1 to 2 μm, an active layer 4 having a thickness of about 0.1 to 2 μm composed of a non-doped compound semiconductor of AlGaInP group having a bandgap energy smaller than the clad layer, and a p-type clad layer 5 composed of a compound semiconductor of AlGaInP group doped with Zn having a carrier concentration of $1 \times 10^{16}$ to $1 \times 10^{19}$ cm$^{-3}$ and having the same composition as the n-type clad layer. This p-type clad layer 5 is coventionally required to have only a sufficient thickness to contain the carriers in the active layer 4, and is normally formed to the thickness of about 0.5 μm. According to the present invention, however, as a result of studying the optimum value of the thickness, a superior result has been obtained when the p-type clad layer 5 is formed to the thickness of not less than about 2 μm as described above. The emitting layer forming portion 11 may be laid on the GaAs substrate 1 through a buffer layer not shown.

In such a case, the buffer layer is made of n-type GaAs having a thickness of about 0.1 to 2 μm and a carrier concentration of about $1 \times 10^{17}$ to $1 \times 10^{19}$ cm$^{-3}$.

The current diffusion layer 6 is formed with a high carrier concentration to absorb light as little as possible to secure an ohmic contact with the p-side electrode 8. Specifically, the current diffusion layer 6 is composed of a GaP layer having a carrier concentration of $2 \times 10^{18}$ to $2 \times 10^{19}$ cm$^{-3}$ and having so large a band gap energy that light is hardly absorbed. This current diffusion layer 6 is normally formed to the thickness of about 10 to 70 μm in order to diffuse the current widely in the chip. According to this invention, however, after studying the optimum value of the thickness, a superior result was obtained by forming it to the thickness of about 3 to 7 μm as described above.

The front surface of the current diffusion layer 6 is formed with the p-side electrode 8 of Au—Ti alloy, Au—Ge—Ni alloy or the like, and the reverse side of the GaAs substrate 1 is formed with an n-side electrode 9 of Au—Ge—Ni alloy or the like.

Now, an explanation will be given of the result of study made to produce the optimum value for the p-type clad layer 5 and the current diffusion layer 6 for improving the luminance.

Figure 2:
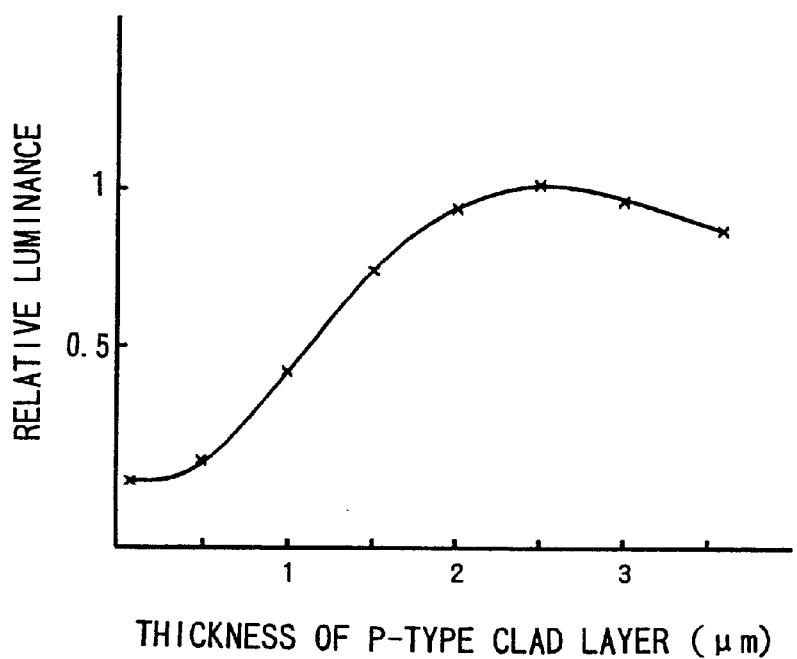
FIG. 2 is a diagram showing the change in luminance with various thickness of the p-type clad layer in a structure of FIG. 1.

First, with the strecture described above, the thickness of the current diffusion layer 6 is set to 50 μm, and the same conditions are set for all the component parts other than the p-type clad layer 5. The thickness tp of the p-type clad layer 5 was variously changed among 0.2 μm, 0.5 μm, 1 μm, 1.5 μm, 2 μm, 2.5 μm, 3 μm and 3.5 μm. The luminance of the p-type clad layers 5 of these various thickness was measured under the same condition. The result is shown in FIG. 2 as relative luminance. As seen from FIG. 2, the luminance is low when the thickness of the p-type clad layer 5 is smaller than about 2 μm, and the luminance is improved and stabilized for the thickness of not less than about 2 μm. This is considered due to the fact that for the thickness $t_p$ of the p-type clad layer 5 not less than about 2 μm, the absorption of light by the p-type clad layer 5 increases while the lattice distortion due to the difference in lattice constant between the p-type clad layer 5 and the current diffusion layer 6 is held in the p-type clad layer 5 but does not affect the active layer 4.

Figure 3:
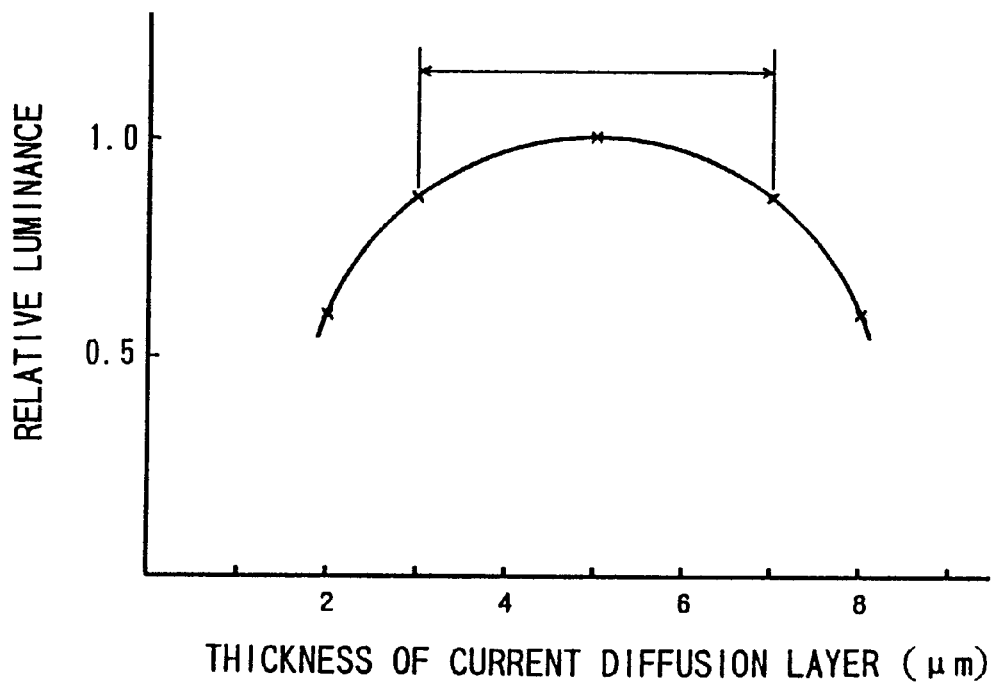
FIG. 3 is a diagram showing the change in luminance with various thickness of the current diffusion layer in a structure of FIG. 1.
Figure 4:
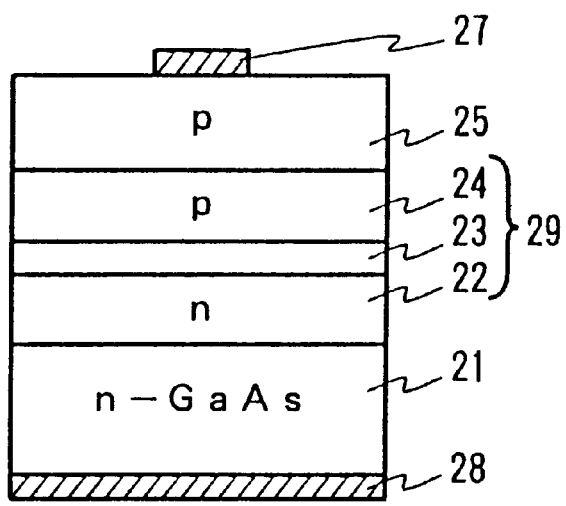
FIG. 4 is a diagram showing a sectional structure of a conventional semiconductor light emitting device.

Now, with the thickness of the p-type clad layer maintained constant at 0.5 μm and the thickness of all the layers other than the current diffusion layer 6 also maintained constant as in the preceding case, only the thickness $t_w$ of the current diffusion layer 6 was changed variously and the illumination characteristic was studied. As a result, it was found that the luminance is improved for a small thickness not more than 10 μm. The result of a further detailed study conducted in the range of 2 to 8 μm is shown in FIG. 3. In this case, too, the luminance is a relative value but not a measurement of an absolute value. As seen from FIG. 3, the luminance is highest for the thickness of about 5 μm, and the luminance is reduced for the thickness larger or smaller than about 5 μm. In other words, a high luminance can be maintained by setting the thickness $t_w$ of the current diffusion layer 6 in the approximate range of 3 to 7 μm. This is considered due to the fact that for the thickness smaller than about 3 μm, the current cannot be sufficiently diffused and the illumination area is reduced for a reduced luminance For the thickness larger than 7 μm, on the other hand, the distortion due to the lattice mismatch with the p-type clad layer increases to such an extent that the active layer is also affected. For the thickness $t_w$ of the current diffusion layer 6 not more than about 10 μm, the carrier concentration was set to a high value in the range of $2\times10^{18}$ to $2\times10^{19}$ cm$^{-3}$ so that the current can be sufficiently diffused in a thin layer. In a method for diffusing the current, instead of setting the carrier concentration to high level, the surface of the device is formed with a current-diffusing metal layer of Ni—Au alloy or the like sufficiently thin to transmit the light.

To fabricate a semiconductor light emitting device having the structure described above, an n-type GaAs substrate 1 is placed in a MOCVD unit, for example. A reactive gas such as trimethyl gallium (hereinafter called TEG) or trimethyl gallium (hereinafter called TMG), arsine (hereinafter called AsH$_3$) and H$_2$Se constituting a dopant gas for Se are introduced together with the carrier gas of hydrogen (H$_2$). A buffer layer (not shown) made of n-type GaAs epitaxially grown at about 500 to 800° C. and doped with Se to the carrier concentration of about $1\times10^{18}$ cm$^{-3}$ is formed to the thickness of about 0.1 μm. Then, instead of AsH$_3$, phosphine (hereinafter called PH$_3$) and further, TMA and trimethyl indium (hereinafter called TMIn) are introduced thereby to epitaxially grow an n-type clad layer 3 of $(Al_{0.7}Ga_{0.3})_{0.51}In_{0.49}P$ with a carrier concentration of about $1\times10^{17}$ to $1\times10^{19}$ cm$^{-3}$ and about 0.5 μm thick; the reactive gas TMA is reduced while TMG is increased thereby to epitaxially grow a non-doped active layer 4 of $(Al_{0.25}Ga_{0.75})_{0.51}In_{0.49}P$ and about 0.5 μm thick; with a reactive gas similar to the one used for the n-type clad layer 3, dimethyl zinc (DMZn), instead of the dopant gas H$_2$Se, is introduced as a dopant gas for Zn thereby to epitaxially grow a p-type clad layer 5 of $(Al_{0.7}Ga_{0.3})_{0.51}In_{0.49}P$ with a carrier concentration of $1\times10^{16}$ to $1\times10^{19}$ cm$^{-3}$ and about 3 μm thick.

Further, while introducing the dopant gas of DMZn, the growth of GaP is continued with the reactive gases TMG and PH$_3$ thereby to form a current diffusion layer 6 with a carrier concentration of about $2\times10^{18}$ to $2\times10^{19}$ cm$^{-3}$ and about 5 μm thick. In the prior art, the requirement of forming a very thick current diffusion layer has made it necessary to use a different growth means such as the liquid phase growth process. The current diffusion layer 6 of this order of thickness, however, can be grown continuously by the MOCVD process.

Figure 5:
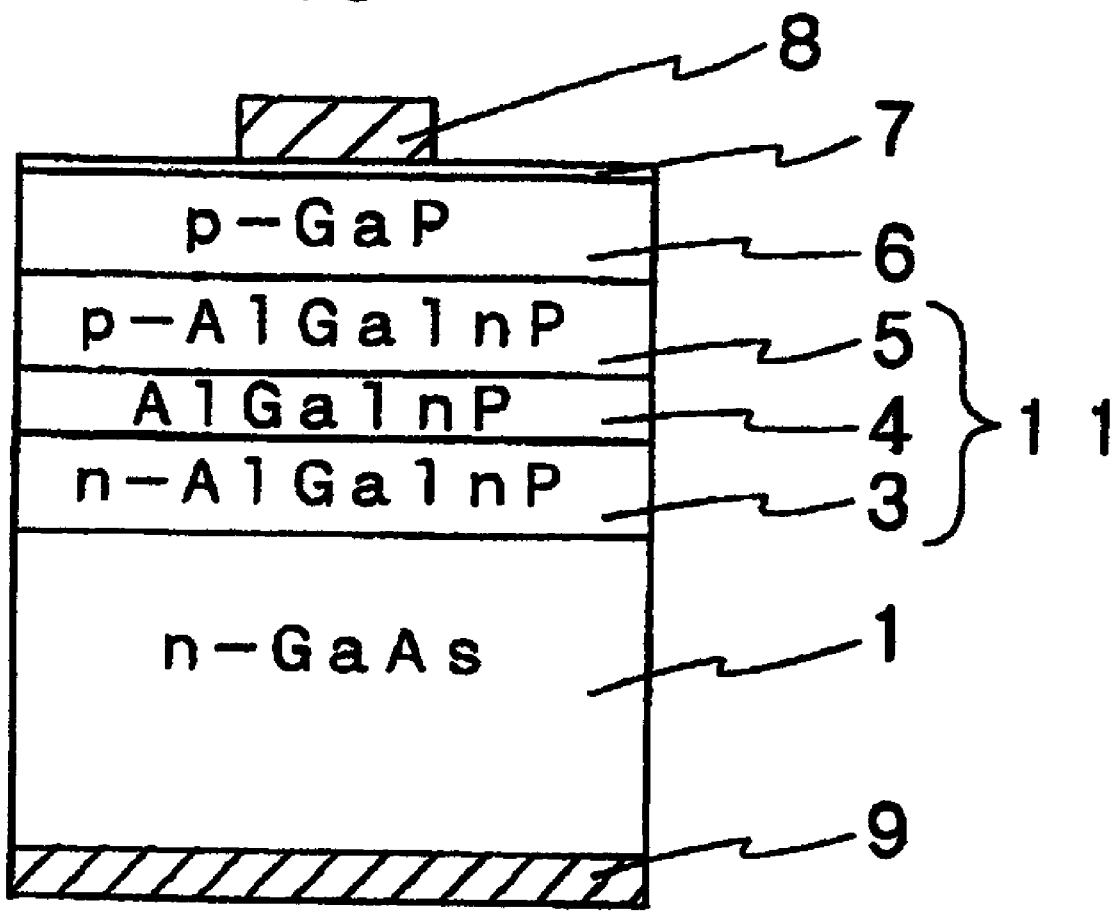
FIG. 5 is a diagram showing the sectional structure of an example of a semiconductor light emitting device according to the present invention.

Next, the wafer is placed in the vacuum evaporation unit in which Ni and Au films are formed to the thickness of about 1 to 20 nm, respectively, and, sintered at about 100 to 400° C. for about 0.1 to 10 minutes, thereby forming a diffusion metal layer 7(a metal layer sufficiently thin to transmit light) of an Au—Ni alloy (see FIG. 5) to the thickness of about 0.2 to 40 nm. Similarly, an upper electrode (p-side electrode) 8 of Au—Ti alloy or Au—Ge—Ni alloy and a lower electrode (n-side electrode) 9 of Au—Ge—Ni alloy are formed by vacuum evaporation or the like and patterning on the surface of the diffusion metal layer. The resulting wafer is diced into chips.

With a structure according to the present invention in which a current diffusion layer of GaP is formed on an emitting layer forming portion made of a compound semiconductor of AlGaInP group and a p-type clad layer about 2 μm or thicker is formed adjacently to the current diffusion layer, for example, the distortion due to the difference in lattice constant between the compound semiconductor of AlGaInP group and GaP is absorbed into the thick p-type clad layer thereby to prevent the distortion from affecting the active layer. As a result, even when the light absorbed into the thick clad layer is increased somewhat, the effect of preventing the distortion from affecting the active layer is increased for an improved luminance.

Also, according to this invention in which the current diffusion layer of GaP is formed as thin as about 3 to 7 μm, the Gap layer is not very thick relative to the emitting layer forming portion made of a compound semiconductor of AlGaInP group. Therefore, the distortion due to the current diffusion layer works to a lesser degree and does not extend much toward the active layer. With the thinning of the current diffusion layer, on the other hand, the current is not easily diffused over the whole chip. An increased carrier concentration of the current diffusion layer or the provision of a metal layer (diffusion metal layer) sufficiently thin to transmit the light on the surface of the current diffusion layer, however, can assure sufficient diffusion of the current. Consequently, light is emitted from the whole area of the chip with a high luminance with the distortion not affecting the active layer. Also, the decreased thickness of the current diffusion layer can grow the semiconductor device continuously in the same growth unit as the semiconductor layer of the emitting layer forming portion in a short time.

Although the aforementioned embodiment uses a specific semiconductor material for each semiconductor layer making up the semiconductor light emitting device with a specific examples of thickness and carrier concentration, the invention is not limited to such cases.

According to this invention, there is provided a semiconductor light emitting device comprising a current diffusion layer of GaP having a large band gap energy formed on the surface of an emitting layer forming portion made of a compound semiconductor of AlGaInP group or AlGaAs group, wherein the effect of the distortion due to the difference in lattice constant is reduced for a high luminance. Further, the thin current diffusion layer can reduce the cost and the operating voltage, thereby realizing a thin semiconductor light emitting device of superior characteristics.

Although preferred example have been described in some detail, it is to be understood that certain changes can be made by those skilled in the art without departing from the spirit and scope of the invention as defined by the appended claims.

What is claimed is:

1. A semiconductor light emitting device comprising:

a substrate of GaAs:

an emitting layer forming portion for forming an emitting layer in which an active layer is sandwiched by clad layers made of a compound semiconductor selected from the group consisting of AlGaInP group and AlGaAs group formed on said substrate; and a current diffusion layer of GaP formed on a front surface of said emitting layer forming portion;

wherein a clad layer between said active layer and said current diffusion layer is formed to a thickness of not less than about 2 $\mu$m.

2. A semiconductor light emitting device according to claim 1, wherein said current diffusion layer is formed to a thickness of not more than 10 $\mu$m.

3. A semiconductor light emitting device according to claim 2, wherein a carrier concentration of said current diffusion layer is $2\times10^{18}$ to $2\times10^{19}$ cm$^{-3}$.

4. A semiconductor light emitting device according to claim 2, wherein a metal layer sufficiently thin to transmit light therethrough is formed on a surface of said current diffusion layer.

5. A semiconductor light emitting device according to claim 1, wherein said current diffusion layer is formed to a thickness of about 3 to 7 $\mu$m.

6. A semiconductor light emitting device according to claim 5, wherein a carrier concentration of said current diffusion layer is $2\times10^{18}$ to $2\times10^{19}$ cm$^{-3}$.

7. A semiconductor light emitting device according to claim 5, wherein a metal layer sufficiently thin to transmit light therethrough is formed on a surface of said current diffusion layer.

8. A semiconductor light emitting device comprising:

an n-type GaAs substrate;

an n-type clad layer made of a compound semiconductor of n-type AlGaInP group formed on said substrate;

an active layer made of a compound semiconductor of AlGaInP group having a band gap energy smaller than said n-type clad layer;

a p-type clad layer formed on said active layer and made of a compound semiconductor of p-type AlGaInP group having a larger band gap energy than said active layer; and a current diffusion layer made of p-type GaP formed on said p-type clad layer;

wherein said p-type clad layer is formed to a thickness of not less than about 2 $\mu$m.

* * * * *